(12) United States Patent
Carson

(10) Patent No.: US 7,687,315 B2
(45) Date of Patent: Mar. 30, 2010

(54) STACKED INTEGRATED CIRCUIT PACKAGE SYSTEM AND METHOD OF MANUFACTURE THEREFOR

(75) Inventor: Flynn Carson, Redwood City, CA (US)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 12/045,606

(22) Filed: Mar. 10, 2008

(65) Prior Publication Data
US 2008/0169549 A1 Jul. 17, 2008

Related U.S. Application Data

(63) Continuation of application No. 11/380,596, filed on Apr. 27, 2006, now Pat. No. 7,354,800.

(60) Provisional application No. 60/594,711, filed on Apr. 29, 2005.

(51) Int. Cl.
H01L 21/00 (2006.01)
H01L 23/02 (2006.01)
H05K 7/00 (2006.01)

(52) U.S. Cl. .......... 438/109; 438/110; 438/126; 438/127; 257/685; 257/787; 257/E25.013; 361/760; 361/790; 361/792

(58) Field of Classification Search .......... None
See application file for complete search history.

(56) References Cited

U.S. PATENT DOCUMENTS

| 4,524,121 A | 6/1985 | Gleim et al. |
|---|---|---|
| 4,697,203 A | 9/1987 | Sakai et al. |
| 4,764,804 A | 8/1988 | Sahara et al. |
| 4,894,707 A | 1/1990 | Yamawaki et al. |
| 5,186,383 A | 2/1993 | Melton et al. |
| 5,214,307 A | 5/1993 | Davis |
| 5,214,308 A | 5/1993 | Nishiguchi et al. |
| 5,222,014 A | 6/1993 | Lin |
| 5,229,960 A | 7/1993 | De Givry |
| 5,269,453 A | 12/1993 | Melton et al. |
| 5,340,771 A | 8/1994 | Rostoker |
| 5,373,189 A | 12/1994 | Massit et al. |
| 5,436,203 A | 7/1995 | Lin |
| 5,444,296 A | 8/1995 | Kaul et al. |
| 5,495,398 A | 2/1996 | Takiar et al. |

(Continued)

FOREIGN PATENT DOCUMENTS

EP 0 430 458 A2 6/1991

(Continued)

OTHER PUBLICATIONS

Kim, J. and Boruch, J., "Enabling a Microelectronic WorldTM", AMKOR Technology, Inc.2002 Annual Report, retrieved from Internet<URL:http://media.corporate-ir.net/media_files/iro/11/115640/2002AnnualReport.pdf.

*Primary Examiner*—Alonzo Chambliss
(74) *Attorney, Agent, or Firm*—Mikio Ishimaru

(57) ABSTRACT

An integrated circuit package system including providing a base substrate, attaching a base integrated circuit on the base substrate, attaching a core substrate over the base integrated circuit, attaching a substrate electrical connector between the core substrate and the base substrate, and applying an encapsulant having the core substrate partially exposed over the base integrated circuit.

20 Claims, 3 Drawing Sheets

U.S. PATENT DOCUMENTS

| | | |
|---|---|---|
| 5,550,711 A | 8/1996 | Burns et al. |
| 5,579,207 A | 11/1996 | Hayden et al. |
| 5,607,227 A | 3/1997 | Yasumoto et al. |
| 5,650,667 A | 7/1997 | Liou |
| 5,652,185 A | 7/1997 | Lee |
| 5,734,199 A | 3/1998 | Kawakita et al. |
| 5,744,863 A | 4/1998 | Culnane et al. |
| 5,748,452 A | 5/1998 | Londa |
| 5,760,478 A | 6/1998 | Bozso et al. |
| 5,811,351 A | 9/1998 | Kawakita et al. |
| 5,824,569 A | 10/1998 | Brooks et al. |
| 5,828,128 A | 10/1998 | Higashiguchi et al. |
| 5,854,507 A | 12/1998 | Miremadi et al. |
| 5,874,781 A * | 2/1999 | Fogal et al. ................. 257/777 |
| 5,898,219 A | 4/1999 | Barrow |
| 5,899,705 A | 5/1999 | Akram |
| 5,903,049 A | 5/1999 | Mori |
| 5,963,430 A | 10/1999 | Londa |
| 5,977,640 A | 11/1999 | Bertin et al. |
| 5,977,641 A | 11/1999 | Takahashi et al. |
| 5,982,633 A | 11/1999 | Jeansonne |
| 5,994,166 A | 11/1999 | Akram et al. |
| 6,025,648 A * | 2/2000 | Takahashi et al. ........... 257/778 |
| RE36,613 E | 3/2000 | Ball |
| 6,034,875 A | 3/2000 | Heim et al. |
| 6,075,289 A | 6/2000 | Distefano |
| 6,083,775 A | 7/2000 | Huang et al. |
| 6,083,811 A | 7/2000 | Riding et al. |
| 6,101,100 A | 8/2000 | Londa |
| 6,107,164 A | 8/2000 | Ohuchi |
| 6,118,176 A | 9/2000 | Tao et al. |
| 6,121,682 A | 9/2000 | Kim |
| 6,130,448 A | 10/2000 | Bauer et al. |
| 6,133,626 A | 10/2000 | Hawke et al. |
| 6,143,588 A | 11/2000 | Glenn |
| 6,144,507 A | 11/2000 | Hashimoto |
| 6,157,080 A | 12/2000 | Tamaki et al. |
| 6,165,815 A | 12/2000 | Ball |
| 6,201,266 B1 | 3/2001 | Ohuchi et al. |
| 6,201,302 B1 | 3/2001 | Tzu |
| 6,204,562 B1 | 3/2001 | Ho et al. |
| 6,225,699 B1 | 5/2001 | Ference et al. |
| 6,238,949 B1 | 5/2001 | Nguyen et al. |
| 6,242,932 B1 | 6/2001 | Hembree |
| 6,246,123 B1 | 6/2001 | Landers, Jr. et al. |
| 6,265,766 B1 | 7/2001 | Moden |
| 6,266,197 B1 | 7/2001 | Glenn et al. |
| 6,274,930 B1 | 8/2001 | Vaiyapuri et al. |
| 6,291,263 B1 | 9/2001 | Huang |
| 6,294,406 B1 | 9/2001 | Bertin et al. |
| 6,297,131 B1 | 10/2001 | Yamada et al. |
| 6,316,735 B1 | 11/2001 | Higashiguchi |
| 6,316,838 B1 | 11/2001 | Ozawa et al. |
| 6,333,552 B1 | 12/2001 | Kakimoto et al. |
| 6,340,846 B1 | 1/2002 | LoBianco et al. |
| 6,353,257 B1 | 3/2002 | Huang |
| 6,358,773 B1 | 3/2002 | Lin et al. |
| 6,369,454 B1 | 4/2002 | Chung |
| 6,372,551 B1 | 4/2002 | Huang |
| 6,376,904 B1 | 4/2002 | Haba et al. |
| 6,384,472 B1 | 5/2002 | Huang |
| 6,388,313 B1 | 5/2002 | Lee et al. |
| 6,396,116 B1 | 5/2002 | Kelly et al. |
| 6,400,007 B1 | 6/2002 | Wu et al. |
| 6,407,381 B1 | 6/2002 | Glenn et al. |
| 6,407,456 B1 | 6/2002 | Ball |
| 6,410,861 B1 | 6/2002 | Huang et al. |
| 6,413,798 B2 | 7/2002 | Asada |
| 6,414,381 B1 | 7/2002 | Takeda |
| 6,420,204 B2 | 7/2002 | Glenn |
| 6,420,244 B2 | 7/2002 | Lee |
| 6,424,050 B1 | 7/2002 | Komiyama |
| 6,441,496 B1 | 8/2002 | Chen et al. |
| 6,445,064 B1 | 9/2002 | Ishii et al. |
| 6,455,353 B2 | 9/2002 | Lin |
| 6,462,421 B1 | 10/2002 | Hsu et al. |
| 6,472,732 B1 | 10/2002 | Terui |
| 6,489,676 B2 | 12/2002 | Taniguchi et al. |
| 6,492,726 B1 | 12/2002 | Quek et al. |
| 6,501,165 B1 | 12/2002 | Farnworth et al. |
| 6,503,780 B1 | 1/2003 | Glenn et al. |
| 6,509,639 B1 | 1/2003 | Lin |
| 6,512,219 B1 | 1/2003 | Webster et al. |
| 6,512,303 B2 | 1/2003 | Moden |
| 6,529,027 B1 | 3/2003 | Akram et al. |
| 6,534,419 B1 | 3/2003 | Ong |
| 6,538,319 B2 | 3/2003 | Terui |
| 6,541,857 B2 | 4/2003 | Caletka et al. |
| 6,545,365 B2 | 4/2003 | Kondo et al. |
| 6,545,366 B2 | 4/2003 | Michii et al. |
| 6,552,423 B2 | 4/2003 | Song et al. |
| 6,555,902 B2 | 4/2003 | Lo et al. |
| 6,555,917 B1 | 4/2003 | Heo |
| 6,566,745 B1 | 5/2003 | Beyne et al. |
| 6,570,249 B1 | 5/2003 | Liao et al. |
| 6,580,169 B2 | 6/2003 | Sakuyama et al. |
| 6,583,503 B2 | 6/2003 | Akram et al. |
| 6,590,281 B2 | 7/2003 | Wu et al. |
| 6,593,647 B2 | 7/2003 | Ichikawa |
| 6,593,648 B2 | 7/2003 | Emoto |
| 6,593,662 B1 | 7/2003 | Pu et al. |
| 6,599,779 B2 | 7/2003 | Shim et al. |
| 6,607,937 B1 | 8/2003 | Corisis |
| 6,610,563 B1 | 8/2003 | Waitl et al. |
| 6,611,063 B1 | 8/2003 | Ichinose et al. |
| 6,613,980 B1 | 9/2003 | McGhee et al. |
| 6,617,198 B2 | 9/2003 | Brooks |
| 6,621,169 B2 | 9/2003 | Kikuma et al. |
| 6,621,172 B2 | 9/2003 | Nakayama et al. |
| 6,627,864 B1 | 9/2003 | Glenn et al. |
| 6,627,979 B2 | 9/2003 | Park |
| 6,642,609 B1 | 11/2003 | Minamio et al. |
| 6,649,445 B1 | 11/2003 | Qi et al. |
| 6,649,448 B2 | 11/2003 | Tomihara |
| 6,650,019 B2 | 11/2003 | Glenn et al. |
| 6,667,556 B2 | 12/2003 | Moden |
| 6,674,156 B1 | 1/2004 | Bayan et al. |
| 6,690,089 B2 | 2/2004 | Uchida |
| 6,692,993 B2 | 2/2004 | Li et al. |
| 6,693,364 B2 | 2/2004 | Tao et al. |
| 6,700,178 B2 | 3/2004 | Chen et al. |
| 6,700,192 B2 | 3/2004 | Matsuzawa et al. |
| 6,706,557 B2 | 3/2004 | Koopmans |
| 6,707,140 B1 | 3/2004 | Nguyen et al. |
| 6,713,366 B2 | 3/2004 | Mong et al. |
| 6,716,670 B1 | 4/2004 | Chiang |
| 6,734,539 B2 | 5/2004 | Degani et al. |
| 6,734,552 B2 | 5/2004 | Combs et al. |
| 6,734,569 B2 | 5/2004 | Appelt et al. |
| 6,737,750 B1 | 5/2004 | Hoffman et al. |
| 6,740,980 B2 | 5/2004 | Hirose |
| 6,746,894 B2 | 6/2004 | Fee et al. |
| 6,747,361 B2 | 6/2004 | Ichinose |
| 6,762,488 B2 | 7/2004 | Maeda et al. |
| 6,777,799 B2 | 8/2004 | Kikuma et al. |
| 6,777,819 B2 | 8/2004 | Huang |
| 6,784,534 B1 | 8/2004 | Glenn et al. |
| 6,787,915 B2 | 9/2004 | Uchida et al. |
| 6,787,916 B2 | 9/2004 | Halahan |
| 6,791,036 B1 | 9/2004 | Chen et al. |
| 6,791,076 B2 | 9/2004 | Webster |
| 6,794,741 B1 | 9/2004 | Lin et al. |
| 6,794,749 B2 | 9/2004 | Akram |
| 6,809,405 B2 | 10/2004 | Ito et al. |

| | | |
|---|---|---|
| 6,818,980 B1 | 11/2004 | Pedron, Jr. |
| 6,828,665 B2 | 12/2004 | Pu et al. |
| 6,833,612 B2 | 12/2004 | Kinsman |
| 6,835,598 B2 | 12/2004 | Baek et al. |
| 6,838,761 B2 | 1/2005 | Karnezos |
| 6,847,105 B2 | 1/2005 | Koopmans |
| 6,851,598 B2 | 2/2005 | Gebauer et al. |
| 6,861,288 B2 * | 3/2005 | Shim et al. .................. 438/109 |
| 6,861,683 B2 | 3/2005 | Rissing et al. |
| 6,864,566 B2 | 3/2005 | Choi |
| 6,881,611 B1 | 4/2005 | Fukasawa et al. |
| 6,882,057 B2 | 4/2005 | Hsu |
| 6,890,798 B2 | 5/2005 | McMahon |
| 6,900,079 B2 | 5/2005 | Kinsman et al. |
| 6,900,528 B2 | 5/2005 | Mess et al. |
| 6,900,549 B2 | 5/2005 | Brooks |
| 6,906,415 B2 | 6/2005 | Jiang et al. |
| 6,906,416 B2 | 6/2005 | Karnezos |
| 6,930,378 B1 | 8/2005 | St. Amand et al. |
| 6,930,396 B2 | 8/2005 | Kurita et al. |
| 6,933,598 B2 | 8/2005 | Karnezos |
| 6,951,982 B2 | 10/2005 | Chye et al. |
| 6,972,481 B2 | 12/2005 | Karnezos |
| 7,034,387 B2 | 4/2006 | Karnezos |
| 7,034,388 B2 | 4/2006 | Yang et al. |
| 7,045,887 B2 | 5/2006 | Karnezos |
| 7,049,691 B2 | 5/2006 | Karnezos |
| 7,053,476 B2 | 5/2006 | Karnezos |
| 7,053,477 B2 | 5/2006 | Karnezos et al. |
| 7,057,269 B2 | 6/2006 | Karnezos |
| 7,061,088 B2 | 6/2006 | Karnezos |
| 7,064,426 B2 | 6/2006 | Karnezos |
| 7,071,568 B1 | 7/2006 | St. Amand et al. |
| 7,081,678 B2 | 7/2006 | Liu |
| 7,084,500 B2 | 8/2006 | Swnson et al. |
| 7,090,482 B2 | 8/2006 | Tsukahara et al. |
| 7,093,358 B2 | 8/2006 | Akram et al. |
| 7,101,731 B2 | 9/2006 | Karnezos |
| 7,109,574 B2 | 9/2006 | Chiu et al. |
| 7,115,990 B2 | 10/2006 | Kinsman |
| 7,119,427 B2 | 10/2006 | Kim |
| 7,122,906 B2 | 10/2006 | Doan |
| 7,176,506 B2 | 2/2007 | Beroz et al. |
| 7,183,191 B2 | 2/2007 | Kinsman et al. |
| 7,218,005 B2 | 5/2007 | Tago |
| 7,221,059 B2 | 5/2007 | Farnworth et al. |
| 7,298,045 B2 | 11/2007 | Fujitani et al. |
| 7,335,994 B2 | 2/2008 | Klein et al. |
| 7,354,800 B2 * | 4/2008 | Carson ..................... 438/109 |
| 7,456,495 B2 * | 11/2008 | Pohl et al. ..................... 257/686 |
| 2001/0055834 A1 | 12/2001 | Lin |
| 2002/0024124 A1 | 2/2002 | Hashimoto |
| 2002/0096755 A1 | 7/2002 | Fukui et al. |
| 2002/0100955 A1 | 8/2002 | Potter et al. |
| 2002/0130404 A1 | 9/2002 | Ushijima et al. |
| 2003/0008510 A1 | 1/2003 | Grigg et al. |
| 2003/0113952 A1 | 6/2003 | Sambasivam et al. |
| 2003/0153134 A1 | 8/2003 | Kawata et al. |
| 2004/0016939 A1 | 1/2004 | Akiba et al. |
| 2004/0061213 A1 | 4/2004 | Karnezos |
| 2004/0119153 A1 | 6/2004 | Karnezos |
| 2004/0124540 A1 | 7/2004 | Chen et al. |
| 2004/0166605 A1 | 8/2004 | Kuratomi et al. |
| 2004/0201087 A1 | 10/2004 | Lee |
| 2004/0212096 A1 | 10/2004 | Wang |
| 2005/0051882 A1 | 3/2005 | Kwon et al. |
| 2005/0075053 A1 | 4/2005 | Jung |
| 2006/0043556 A1 | 3/2006 | Su et al. |
| 2006/0065958 A1 | 3/2006 | Tsao et al. |
| 2006/0138631 A1 | 6/2006 | Tao et al. |
| 2006/0189033 A1 | 8/2006 | Kim |
| 2006/0197209 A1 | 9/2006 | Choi et al. |
| 2006/0244157 A1 | 11/2006 | Carson |
| 2007/0114648 A1 * | 5/2007 | Karnezos ................... 257/686 |

FOREIGN PATENT DOCUMENTS

| | | |
|---|---|---|
| EP | 0 652 630 A2 | 5/1995 |
| JP | 05152505 A | 6/1993 |
| JP | 2000228468 | 8/2000 |
| JP | 2001223326 A | 8/2001 |
| JP | 2003086733 | 3/2003 |
| KR | 2001068614 A | 7/2001 |
| KR | 2004085348 A | 10/2004 |
| WO | 98/50954 A1 | 11/1998 |
| WO | 02/084716 A2 | 10/2002 |
| WO | 03/032370 A2 | 4/2003 |
| WO | WO2004034433 A2 | 4/2004 |

* cited by examiner

STACKED INTEGRATED CIRCUIT PACKAGE SYSTEM AND METHOD OF MANUFACTURE THEREFOR

CROSS-REFERENCE TO RELATED APPLICATION

This application is a continuation of U.S. patent application Ser. No. 11/380,596, now U.S. Pat. No. 7,354,800, filed Apr. 27, 2006, which claims the benefit of U.S. Provisional Patent Application Ser. No. 60/594,711 filed Apr. 29, 2005, and the subject matter thereof is hereby incorporated herein by reference thereto.

The present application contains subject matter related to U.S. patent application Ser. No. 11/394,635 which claims the benefit of U.S. Provisional Application Ser. No. 60/594,711 and U.S. Provisional Application Ser. No. 60/692,842.

The present application also contains subject matter related to 1) U.S. patent application Ser. No. 11/395,529, which is a Nonprovisional of U.S. Provisional Application Ser. No. 60/667,277 and U.S. Provisional Application Ser. No. 60/692,182, and 2) U.S. patent application Ser. No. 11/397,027, which is a Nonprovisional of U.S. Provisional Application Ser. No. 60/667,277 and U.S. Provisional Application Ser. No. 60/692,183. Both U.S. patent applications Ser. Nos. 11/395,529 and 11/397,027 are continuation-in-part of U.S. application Ser. No. 11/306,628 which claims the benefit of U.S. Provisional Application Ser. No. 60/667,277. All of these related applications are assigned to STATS ChipPAC Ltd.

TECHNICAL FIELD

The present invention relates generally to package systems, and more particularly to a system for stacked integrated circuit packages.

BACKGROUND ART

The very small and very large numbers of circuits on the integrated circuit die, generally require some housing and protection from the system or product environment. This housing and protection often takes the form of an integrated circuit package that provides a mechanism for making electrical interconnection between the circuits on the integrated circuit die and the leads that are utilized to make electrical interconnections to circuits, power, and ground external to the integrated circuit die. For early types of integrated circuits, the packaging of the integrated circuits was relatively straightforward and generally involved an array of leads arranged around a die cavity to be electrically connected to associated die pads. There were also relatively few circuits on each integrated circuit die, and the circuit operational rates were by modern day standards relatively slow.

Across virtually all applications, there continues to be growing demand for reducing size and increasing performance of integrated circuits. The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuit packages. To meet these needs, packaging technologies are increasingly using smaller form factors with more circuits.

Wafer manufacturers strive to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to integrated circuit packaging as a means to fulfill the relentless demands for enhanced system performance.

Drawbacks of conventional designs include a relatively large footprint of the package on the mounting surface of motherboard. The footprint typically reflects the maximum planar dimension of the package, namely, the x-y dimension of the package. In applications where mounting space is at a premium, such as pagers, portable telephones, and personal computers, among others, a large footprint is undesirable at best. With the goal of increasing the amount of circuitry in a package without increasing the area of the package, so that the package does not take up any more space on the circuit board, manufacturers have been stacking two or more die within a single package. Unfortunately, sufficient overlap for electrical interconnect and large footprint top packages have plagued previous stacked package or package on package designs.

Thus, a need still remains for an integrated circuit package system to provide improved function, area, volume, and manufacturing yield. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a base substrate, attaching a base integrated circuit on the base substrate, attaching a core substrate over the base integrated circuit, attaching a substrate electrical connector between the core substrate and the base substrate, and applying an encapsulant having the core substrate partially exposed over the base integrated circuit.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
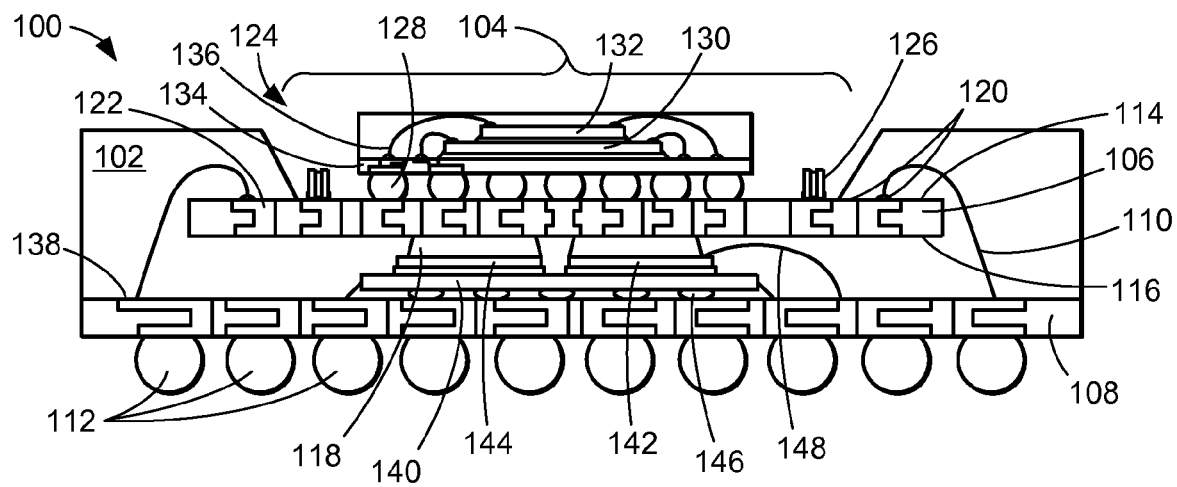
FIG. 1 is a cross-sectional view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system 100 in an embodiment of the present invention. The integrated circuit package system 100 includes an encapsulant 102 having an encapsulant recess 104 on a core substrate 106, such as an interposer. The core substrate 106 can be made of many materials, such as laminate substrate, Si, ceramic, metal leadframe, or other materials, and can include embedded features such as passive devices or electrical shields.

The core substrate 106 is connected to a base substrate 108, such as an interposer, with substrate electrical connectors 110, such as bond wires. The base substrate 108 can be made of many materials, such as laminate substrate, Si, ceramic, metal leadframe, or other materials, and can include embedded features such as passive devices or electrical shields. The base substrate 108 can include package electrical connectors 112, such as solder balls, for external connections of any components in the integrated circuit package system 100 to a next level system, such as another package or a printed circuit board.

The core substrate 106 includes a mounting surface 114 and an attachment surface 116. The attachment surface 116 can be attached over the base substrate by an attachment layer 118. The mounting surface 114 and the attachment surface 116 include core connection pads 120, such as land pads, and core substrate connections 122, such as traces and vias. The core substrate connections 122 can connect the core connection pads 120 to one another or the core connection pads 120 to other pads (not shown) or other traces (not shown) of the attachment surface 116 on a side of the core substrate 106 opposite the base substrate 108. The encapsulant recess 104 is also formed on the mounting surface 114 by the encapsulant 102 directly on a perimeter portion preferably at an edge of the mounting surface 114 covering the substrate electrical connectors 110 and substantially exposing a center portion of the mounting surface 114.

The core connection pads 120 can electrically connect other packages, such as a top package 124, and other devices 126, such as passive devices, to the base substrate 108. The core connection pads 120 can also provide a surface for applying solder on pad (not shown) to the core substrate 106. The core substrate 106 can optionally require less routing density than the base substrate 108, thereby providing the core substrate 106 with a cost lower than a cost of the base substrate 108. Thus, the core substrate 106 is defined as a substrate having the core substrate connections 122 for connecting the core connection pads 120 on the mounting surface 114 to one another or to other pads or traces on the attachment surface 116.

The top package 124 is connected to the core connection pads 120 with top electrical connectors 128, such as solder balls. The top package 124 includes a first top integrated circuit 130, such as a memory device, and a second top integrated circuit 132, such as a memory device. The first top integrated circuit 130 and the second top integrated circuit 132 can connect to the core substrate 106 through the top electrical connectors 128, a top substrate 134, and top integrated circuit connectors 136. For illustrative purposes, two integrated circuits are shown in the top package 124 although it is understood that any number of integrated circuits may be used. Further, for illustrative purposes, the top package 124 is shown including the top integrated circuit connectors 136, the top substrate 134 and the top electrical connectors 128 although it is understood that any connection technology may be used.

A top side or a bottom side of the base substrate 108 includes base connection pads 138, a first base integrated circuit 140, such as a first flipchip, a second base integrated circuit 142, such as a wirebond chip, a third base integrated circuit 144, such as a second flipchip, or a dummy chip (not shown), such as a spacer die. The base connection pads 138 can electrically connect other devices (not shown), such as passive devices. The other devices can be mounted on the top side or the bottom side of the base substrate 108.

The first base integrated circuit 140 connects to the base substrate 108 with first base electrical connectors 146, such as solder bumps. The second base integrated circuit 142 attaches to the first base integrated circuit 140 and connects to the base substrate 108 with second base electrical connectors 148, such as wire bonds. The third base integrated circuit 144 connects to the first base integrated circuit 140 with third base electrical connectors, not shown. The attachment surface 116 of the core substrate 106 can be attached to the attachment layer 118 on the second base integrated circuit 142 and the third base integrated circuit 144. A portion of the attachment surface 116 and a side of the core substrate connections 122 facing the base substrate 108 can be exposed from the attachment layer 118.

For illustrative purposes, three integrated circuits are shown between the core substrate 106 and the base substrate 108 although it is understood that any number of integrated circuits may be used. Further, for illustrative purposes, the first base electrical connectors 146 are shown as solder bumps although it is understood that any connection technology may be used. Yet further, for illustrative purposes, the second base electrical connectors 148 are shown as bond wires although it is understood that any connection technology may be used.

Figure 2:
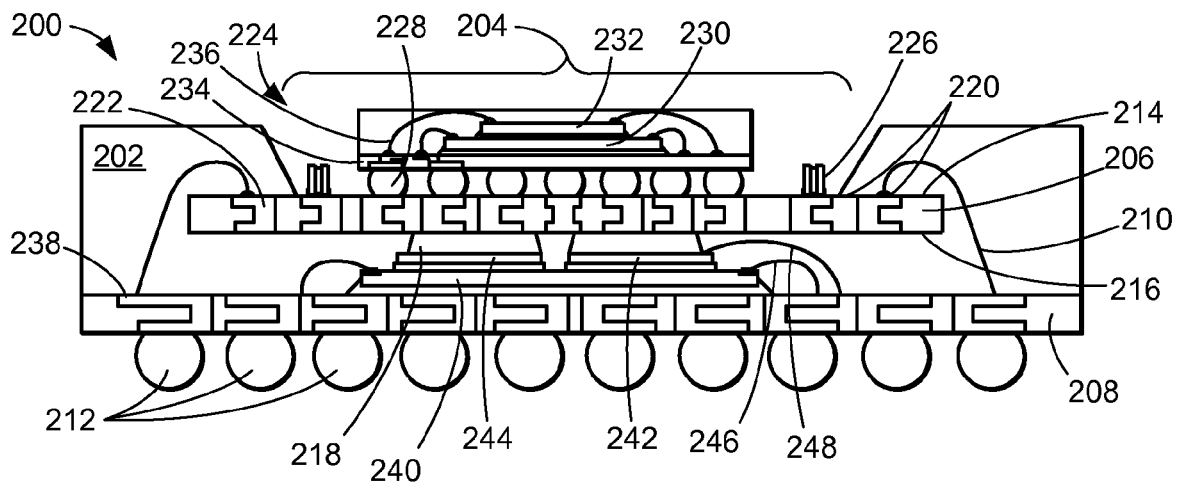
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100 of FIG. 1, the integrated circuit package system 200 includes an encapsulant 202 having an encapsulant recess 204 on a core substrate 206, such as an interposer. The core substrate 206 can be made of many materials, such as laminate substrate, Si, ceramic, metal leadframe, or other materials, and can include embedded features such as passive devices or electrical shields.

The core substrate 206 is connected to a base substrate 208, such as an interposer, with substrate electrical connectors 210, such as bond wires. The base substrate 208 can be made of many materials, such as laminate substrate, Si, ceramic, metal leadframe, or other materials, and can include embedded features such as passive devices or electrical shields. The base substrate 208 can include package electrical connectors 212, such as solder balls, for external connections of any components in the integrated circuit package system 200 to a next level system, such as another package or a printed circuit board.

The core substrate 206 includes a mounting surface 214 and an attachment surface 216. The attachment surface 216 can be attached over the base substrate by an attachment layer 218. The mounting surface 214 and the attachment surface 216 include core connection pads 220, such as land pads, and core substrate connections 222, such as traces and vias. The core substrate connections 222 can connect the core connection pads 220 to one another or the core connection pads 220 to other pads (not shown) or other traces (not shown) of the attachment surface 216.

The core connection pads 220 can electrically connect other packages, such as a top package 224, and other devices 226, such as passive devices, to the base substrate 208. The core connection pads 220 can also provide a surface for applying solder on pad (not shown) to the core substrate 206. The core substrate 206 can optionally require less routing density than the base substrate 208, thereby providing the core substrate 206 with a cost lower than a cost of the base substrate 208.

The top package 224 is connected to the core connection pads 220 with top electrical connectors 228, such as solder balls. The top package 224 includes a first top integrated circuit 230, such as a memory device and a second top integrated circuit 232, such as a memory device. The first top integrated circuit 230 and the second top integrated circuit 232 can connect to the core substrate 206 through the top electrical connectors 228, a top substrate 234, and top integrated circuit connectors 236. For illustrative purposes, two integrated circuits are shown in the top package 224 although it is understood that any number of integrated circuits may be used. Further, for illustrative purposes, the top package 224 is shown including the top integrated circuit connectors 236, the top substrate 234 and the top electrical connectors 228 although it is understood that any connection technology may be used.

A top side or a bottom side of the base substrate 208 includes base connection pads 238, a first base integrated circuit 240, such as a first wirebond chip, a second base integrated circuit 242, such as a second wirebond chip, a third base integrated circuit 244, such as a flipchip, or a dummy chip (not shown), such as a spacer die. The base connection pads 238 can electrically connect other devices (not shown), such as passive devices. The other devices can be mounted on the top side or the bottom side of the base substrate 208.

The first base integrated circuit 240 connects to the base substrate 208 with first base electrical connectors 246, such as bond wires. The second base integrated circuit 242 attaches to the first base integrated circuit 240 and connects to the base substrate 208 with second base electrical connectors 248, such as wire bonds. The third base integrated circuit 244 connects to the first base integrated circuit 240 with third base electrical connectors, not shown. The attachment surface 216 of the core substrate 206 can be attached to the attachment layer 218 on the second base integrated circuit 242 and the third base integrated circuit 244.

For illustrative purposes, three integrated circuits are shown between the core substrate 206 and the base substrate 208 although it is understood that any number of integrated circuits may be used. Further, for illustrative purposes, the first base electrical connectors 246 are shown as bond wires although it is understood that any connection technology may be used. Yet further, for illustrative purposes, the second base electrical connectors 248 are shown as bond wires although it is understood that any connection technology may be used.

Figure 3:
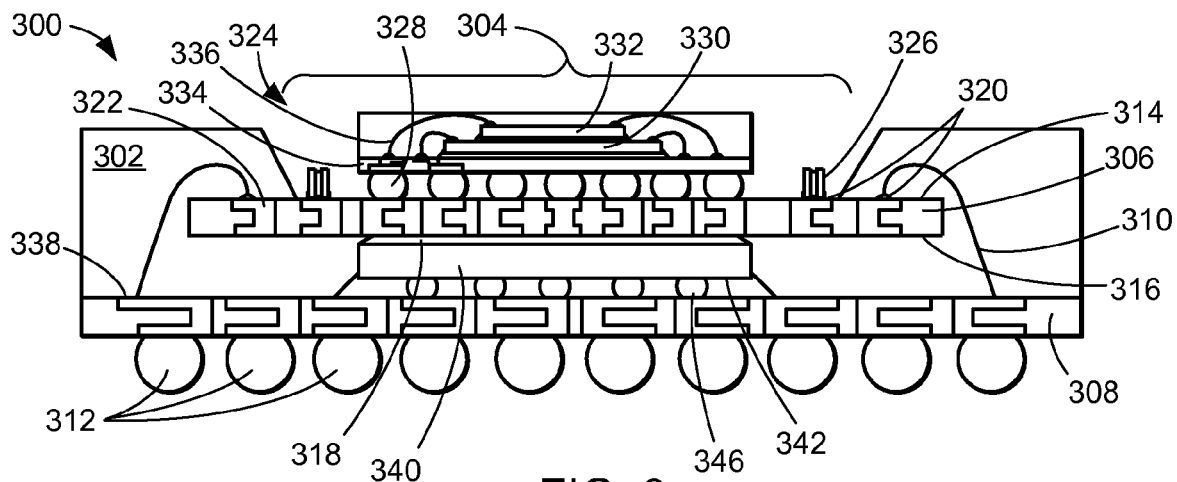
FIG. 3 is a cross-sectional view of an integrated circuit package system in another alternative embodiment of the present invention.

Referring now to FIG. 3, therein is shown a cross-sectional view of an integrated circuit package system 300 in another alternative embodiment of the present invention. In a manner similar to the integrated circuit package system 100 of FIG. 1, the integrated circuit package system 300 includes an encapsulant 302 having an encapsulant recess 304 on a core substrate 306, such as an interposer. The core substrate 306 can be made of many materials, such as laminate substrate, Si, ceramic, metal leadframe, or other materials, and can include embedded features such as passive devices or electrical shields.

The core substrate 306 is connected to a base substrate 308, such as an interposer, with substrate electrical connectors 310, such as bond wires. The base substrate 308 can be made of many materials, such as laminate substrate, Si, ceramic, metal leadframe, or other materials, and can include embedded features such as passive devices or electrical shields. The base substrate 308 can include package electrical connectors 312, such as solder balls, for external connections of any components in the integrated circuit package system 300 to a next level system, such as another package or a printed circuit board.

The core substrate 306 includes a mounting surface 314 and an attachment surface 316. The attachment surface 316 can be attached over the base substrate by an attachment layer 318. The mounting surface 314 and the attachment surface 316 include core connection pads 320, such as land pads, and core substrate connections 322, such as traces and vias. The core substrate connections 322 can connect the core connection pads 320 to one another or the core connection pads 320 to other pads (not shown) or other traces (not shown) of the attachment surface 316.

The core connection pads 320 can electrically connect other packages, such as a top package 324, and other devices 326, such as passive devices, to the base substrate 308. The core connection pads 320 can also provide a surface for applying solder on pad (not shown) to the core substrate 306. The core substrate 306 can optionally require less routing density than the base substrate 308, thereby providing the core substrate 306 with a cost lower than a cost of the base substrate 308.

The top package 324 is connected to the core connection pads 320 with top electrical connectors 328, such as solder balls. The top package 324 includes a first top integrated circuit 330, such as a memory device and a second top integrated circuit 332, such as a memory device. The first top integrated circuit 330 and the second top integrated circuit 332 can connect to the core substrate 306 through the top electrical connectors 328, a top substrate 334, and top integrated circuit connectors 336. For illustrative purposes, two integrated circuits are shown in the top package 324 although it is understood that any number of integrated circuits may be used. Further, for illustrative purposes, the top package 324 is shown including the top integrated circuit connectors 336, the top substrate 334 and the top electrical connectors 328 although it is understood that any connection technology may be used.

A top side or a bottom side of the base substrate 308 includes base connection pads 338, a base integrated circuit 340, such as a flipchip, having a die backside 342. The base connection pads 338 can electrically connect other devices (not shown), such as passive devices. The other devices can be mounted on the top side or the bottom side of the base substrate 308.

The base integrated circuit 340 connects to the base substrate 308 with first base electrical connectors 346, such as solder bumps. The attachment surface 316 of the core substrate 306 can be attached to the attachment layer 318 on the die backside 342. For illustrative purposes, one integrated circuit is shown between the core substrate 306 and the base substrate 308 although it is understood that any number of integrated circuits may be used. Further, for illustrative purposes, the base electrical connectors 346 are shown as solder bumps although it is understood that any connection technology may be used.

Figure 4:
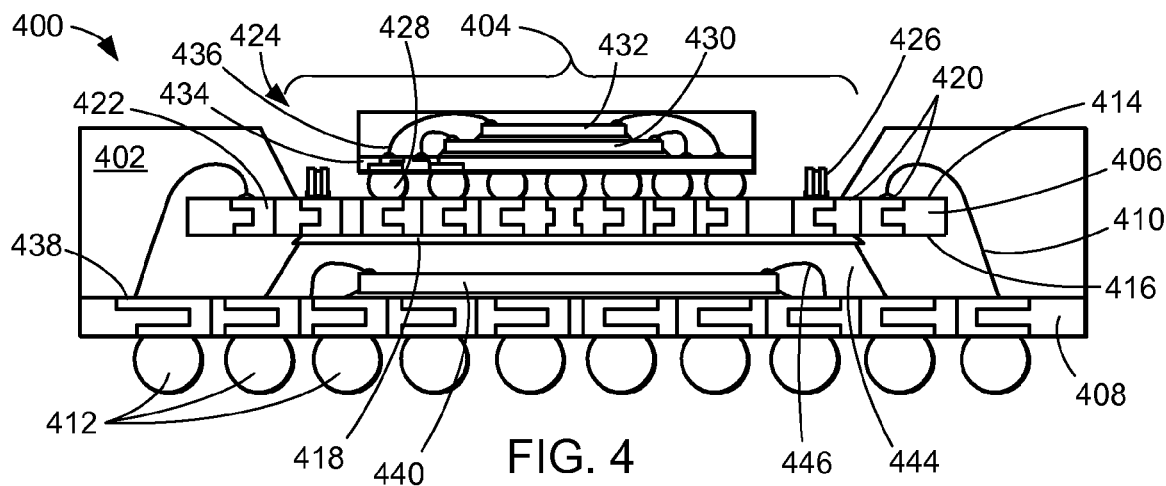
FIG. 4 is a cross-sectional view of an integrated circuit package system in yet another alternative embodiment of the present invention.

Referring now to FIG. 4, therein is shown a cross-sectional view of an integrated circuit package system 400 in yet another alternative embodiment of the present invention. In a manner similar to the integrated circuit package system 100 of FIG. 1, the integrated circuit package system 400 includes an encapsulant 402 having an encapsulant recess 404 on a core substrate 406, such as an interposer. The core substrate 406 can be made of many materials, such as laminate substrate, Si, ceramic, metal leadframe, or other materials, and can include embedded features such as passive devices or electrical shields.

The core substrate 406 is connected to a base substrate 408, such as an interposer, with substrate electrical connectors 410, such as bond wires. The base substrate 408 can be made of many materials, such as laminate substrate, Si, ceramic, metal leadframe, or other materials, and can include embedded features such as passive devices or electrical shields. The base substrate 408 can include package electrical connectors 412, such as solder balls, for external connections of any components in the integrated circuit package system 400 to a next level system, such as another package or a printed circuit board.

The core substrate 406 includes a mounting surface 414 and an attachment surface 416. The attachment surface 416 can be attached over the base substrate by an attachment layer 418. The mounting surface 414 and the attachment surface 416 include core connection pads 420 and core substrate connections 422, such as traces and vias. The core substrate connections 422 can connect the core connection pads 420 to one another or the core connection pads 420 to other pads (not shown) or other traces (not shown) of the attachment surface 416.

The core connection pads 420 can electrically connect other packages, such as a top package 424, and other devices 426, such as passive devices, to the base substrate 408. The core connection pads 420 can also provide a surface for applying solder on pad (not shown) to the core substrate 406.

The core substrate 406 can optionally require less routing density than the base substrate 408, thereby providing the core substrate 406 with a cost lower than a cost of the base substrate 408.

The top package 424 is connected to the core connection pads 420 with top electrical connectors 428, such as solder balls. The top package 424 includes a first top integrated circuit 430, such as a memory device and a second top integrated circuit 432, such as a memory device. The first top integrated circuit 430 and the second top integrated circuit 432 can connect to the core substrate 406 through the top electrical connectors 428, a top substrate 434, and top integrated circuit connectors 436. For illustrative purposes, two integrated circuits are shown in the top package 424 although it is understood that any number of integrated circuits may be used. Further, for illustrative purposes, the top package 424 is shown including the top integrated circuit connectors 436, the top substrate 434 and the top electrical connectors 428 although it is understood that any connection technology may be used.

A top side or a bottom side of the base substrate 408 includes base connection pads 438, a base integrated circuit 440, such as a wirebond chip. The base integrated circuit 440 connects to the base substrate 408 with base electrical connectors 446, such as bond wires. The base connection pads 438 can electrically connect other devices (not shown), such as passive devices. The other devices can be mounted on the top side or the bottom side of the base substrate 408.

A moldcap 444, formed by an overmolding process, covers the base integrated circuit 440 and the base electrical connectors 446. The attachment surface 416 of the core substrate 406 can be attached to the attachment layer 418 on the moldcap 444. For illustrative purposes, one integrated circuit is shown between the core substrate 406 and the base substrate 408 although it is understood that any number of integrated circuits may be used. Further, for illustrative purposes, the base electrical connectors 446 are shown as bond wires although it is understood that any connection technology may be used.

Figure 5:
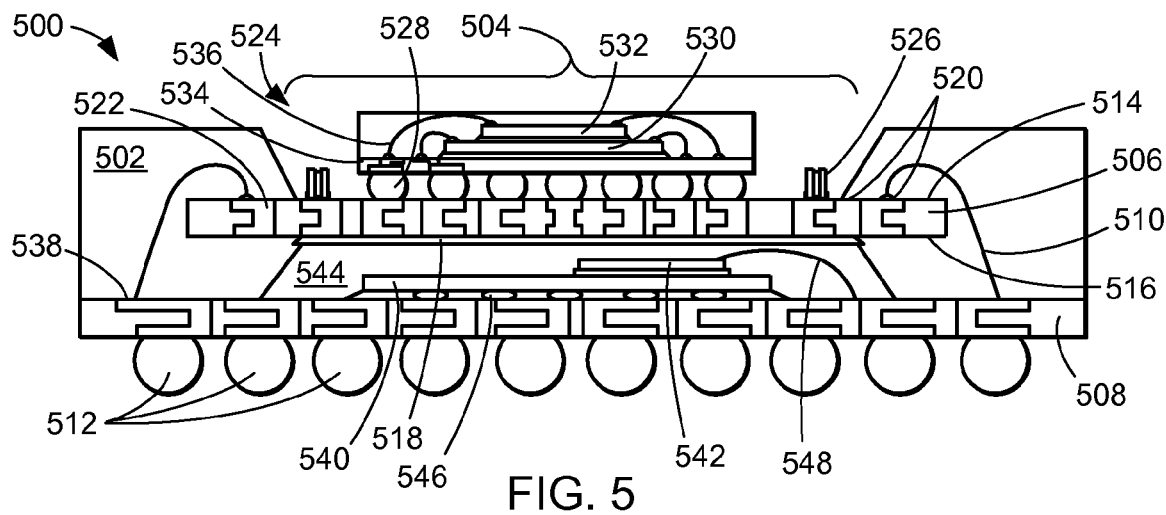
FIG. 5 is a cross-sectional view of an integrated circuit package system in yet another alternative embodiment of the present invention.

Referring now to FIG. 5, therein is shown a cross-sectional view of an integrated circuit package system 500 in yet another alternative embodiment of the present invention. In a manner similar to the integrated circuit package system 100 of FIG. 1, the integrated circuit package system 500 includes an encapsulant 502 having an encapsulant recess 504 on a core substrate 506, such as an interposer. The core substrate 506 can be made of many materials, such as laminate substrate, Si, ceramic, metal leadframe, or other materials, and can include embedded features such as passive devices or electrical shields.

The core substrate 506 is connected to a base substrate 508, such as an interposer, with substrate electrical connectors 510, such as bond wires. The base substrate 508 can be made of many materials, such as laminate substrate, Si, ceramic, metal leadframe, or other materials, and can include embedded features such as passive devices or electrical shields. The base substrate 508 can include package electrical connectors 512, such as solder balls, for external connections of any components in the integrated circuit package system 500 to a next level system, such as another package or a printed circuit board.

The core substrate 506 includes a mounting surface 514 and an attachment surface 516. The attachment surface 516 can be attached over the base substrate by an attachment layer 518. The mounting surface 514 and the attachment surface 516 include core connection pads 520, such as land pads, and core substrate connections 522, such as traces and vias. The core substrate connections 522 can connect the core connection pads 520 to one another or the core connection pads 520 to other pads (not shown) or other traces (not shown) of the attachment surface 516.

The core connection pads 520 can electrically connect other packages, such as a top package 524, and other devices 526, such as passive devices, to the base substrate 508. The core connection pads 520 can also provide a surface for applying solder on pad (not shown) to the core substrate 506. The core substrate 506 can optionally require less routing density than the base substrate 508, thereby providing the core substrate 506 with a cost lower than a cost of the base substrate 508.

The top package 524 is connected to the core connection pads 520 with top electrical connectors 528, such as solder balls. The top package 524 includes a first top integrated circuit 530, such as a memory device, and a second top integrated circuit 532, such as a memory device. The first top integrated circuit 530 and the second top integrated circuit 532 can connect to the core substrate 506 through the top electrical connectors 528, a top substrate 534, and top integrated circuit connectors 536. For illustrative purposes, two integrated circuits are shown in the top package 524 although it is understood that any number of integrated circuits may be used. Further, for illustrative purposes, the top package 524 is shown including the top integrated circuit connectors 536, the top substrate 534 and the top electrical connectors 528 although it is understood that any connection technology may be used.

A top side or a bottom side of the base substrate 508 includes base connection pads 538, a first base integrated circuit 540, such as a first flipchip, and a second base integrated circuit 542, such as a wirebond chip or flipchip. The base connection pads 538 can electrically connect other devices (not shown), such as passive devices. The other devices can be mounted on the top side or the bottom side of the base substrate 508.

The first base integrated circuit 540 connects to the base substrate 508 with first base electrical connectors 546, such as solder bumps. The second base integrated circuit 542 attaches to the first base integrated circuit 540 and connects to the base substrate 508 with second base electrical connectors 548, such as wire bonds. A moldcap 544, formed by an overmolding process, covers the first base integrated circuit 540, the second base integrated circuit 542, and the second base electrical connectors 548. The attachment surface 516 of the core substrate 506 can be attached to the attachment layer 518 on the moldcap 544.

For illustrative purposes, two integrated circuits are shown between the core substrate 506 and the base substrate 508 although it is understood that any number of integrated circuits may be used. Further, for illustrative purposes, the first base electrical connectors 546 are shown as solder bumps although it is understood that any connection technology may be used. Yet further, for illustrative purposes, the second base electrical connectors 548 are shown as bond wires although it is understood that any connection technology may be used.

Figure 6:
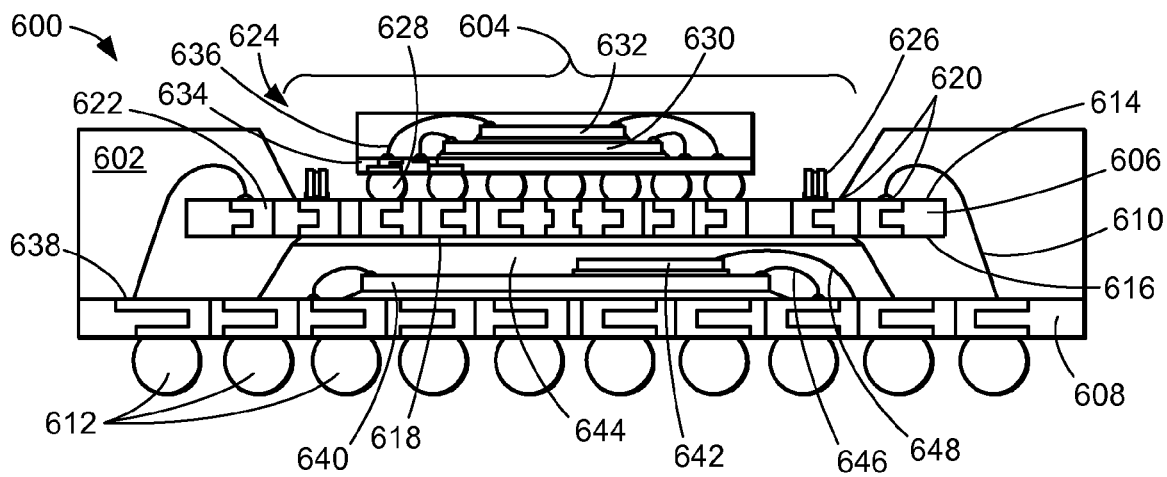
FIG. 6 is a cross-sectional view of an integrated circuit package system in yet another alternative embodiment of the present invention.

Referring now to FIG. 6, therein is shown a cross-sectional view of an integrated circuit package system 600 in yet another alternative embodiment of the present invention. In a manner similar to the integrated circuit package system 100 of FIG. 1, the integrated circuit package system 600 includes an encapsulant 602 having an encapsulant recess 604 on a core substrate 606, such as an interposer. The core substrate 606 can be made of many materials, such as laminate substrate, Si, ceramic, metal leadframe, or other materials, and can include embedded features such as passive devices or electrical shields.

The core substrate 606 is connected to a base substrate 608, such as an interposer, with substrate electrical connectors 610, such as bond wires. The base substrate 608 can be made of many materials, such as laminate substrate, Si, ceramic, metal leadframe, or other materials, and can include embedded features such as passive devices or electrical shields. The base substrate 608 can include package electrical connectors 612, such as solder balls, for external connections of any components in the integrated circuit package system 600 to a next level system, such as another package or a printed circuit board.

The core substrate 606 includes a mounting surface 614 and an attachment surface 616. The attachment surface 616 can be attached over the base substrate by an attachment layer 618. The mounting surface 614 and the attachment surface 616 include core connection pads 620, such as land pads, and core substrate connections 622, such as traces and vias. The core substrate connections 622 can connect the core connection pads 620 to one another or the core connection pads 620 to other pads (not shown) or other traces (not shown) of the attachment surface 616.

The core connection pads 620 can electrically connect other packages, such as a top package 624, and other devices 626, such as passive devices, to the base substrate 608. The core connection pads 620 can also provide a surface for applying solder on pad (not shown) to the core substrate 606. The core substrate 606 can optionally require less routing density than the base substrate 608, thereby providing the core substrate 606 with a cost lower than a cost of the base substrate 608.

The top package 624 is connected to the core connection pads 620 with top electrical connectors 628, such as solder balls. The top package 624 includes a first top integrated circuit 630, such as a memory device and a second top integrated circuit 632, such as a memory device. The first top integrated circuit 630 and the second top integrated circuit 632 can connect to the core substrate 606 through the top electrical connectors 628, a top substrate 634, and top integrated circuit connectors 636. For illustrative purposes, two integrated circuits are shown in the top package 624 although it is understood that any number of integrated circuits may be used. Further, for illustrative purposes, the top package 624 is shown including the top integrated circuit connectors 636, the top substrate 634 and the top electrical connectors 628 although it is understood that any connection technology may be used.

A top side or a bottom side of the base substrate 608 includes base connection pads 638, a first base integrated circuit 640, such as a first wirebond chip, and a second base integrated circuit 642, such as a second wirebond chip or flipchip. The base connection pads 538 can electrically connect other devices (not shown), such as passive devices. The other devices can be mounted on the top side or the bottom side of the base substrate 608.

The first base integrated circuit 640 connects to the base substrate 608 with first base electrical connectors 646, such as bond wires. The second base integrated circuit 642 attaches to the first base integrated circuit 640 and connects to the base substrate 608 with second base electrical connectors 648, such as wire bonds. A moldcap 644, formed by an overmolding process, covers the first base integrated circuit 640, the second base integrated circuit 642, and the second base electrical connectors 648. The attachment surface 616 of the core substrate 606 can be attached to the attachment layer 618 on the moldcap 644.

For illustrative purposes, two integrated circuits are shown between the core substrate 606 and the base substrate 608 although it is understood that any number of integrated circuits may be used. Further, for illustrative purposes, the first base electrical connectors 646 are shown as bond wires although it is understood that any connection technology may be used. Yet further, for illustrative purposes, the second base electrical connectors 648 are shown as bond wires although it is understood that any connection technology may be used.

Figure 7:
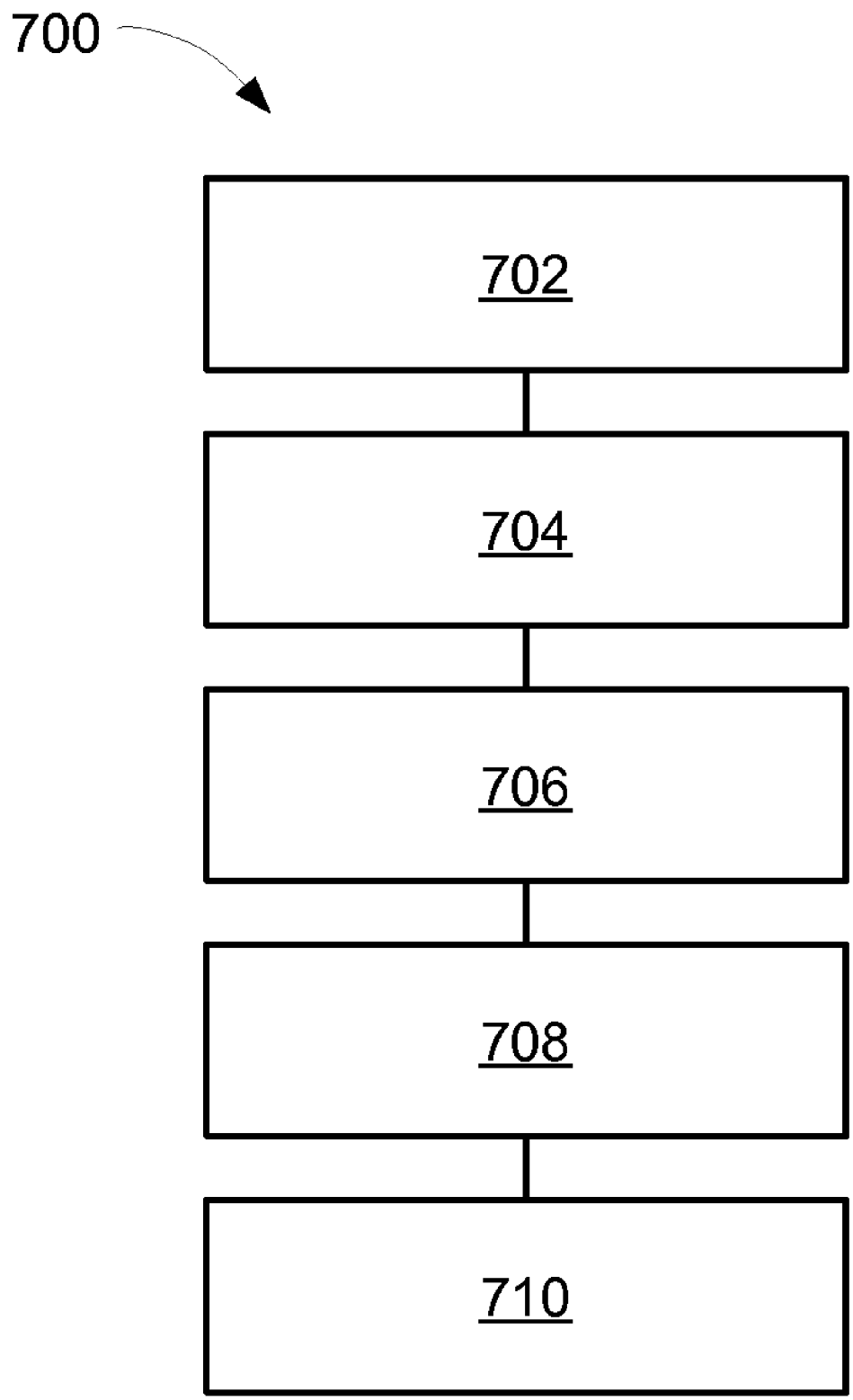
FIG. 7 is a flow chart of an integrated circuit package system for manufacturing the integrated circuit package system in an embodiment of the present invention.

Referring now to FIG. 7 is a flow chart of an integrated circuit package system 700 for manufacturing the integrated circuit package system 100 in an embodiment of the present invention. The system 700 includes providing a base substrate in a block 702; attaching a base integrated circuit on the base substrate in a block 704; attaching a core substrate over the base integrated circuit in a block 706; attaching a substrate electrical connector between the core substrate and the base substrate in a block 708; and applying an encapsulant having the core substrate partially exposed over the base integrated circuit in a block 710.

In greater detail, a method to fabricate the integrated circuit package system 100, in an embodiment of the present invention, is performed as follows:

1. Forming a base substrate having a base connection pad. (FIG. 1)
2. Connecting a base integrated circuit with a base electrical connector on the base substrate. (FIG. 1)
3. Attaching a core substrate on a mounting layer over the base integrated circuit. (FIG. 1)
4. Connecting a substrate electrical connector between the core substrate and the base substrate. (FIG. 1)
5. Forming an encapsulant over the core substrate having a core connection pad exposed over the base integrated circuit. (FIG. 1)
6. Connecting a top electrical connector between a top integrated circuit and the core connection pad. (FIG. 1)

It has been discovered that the present invention thus has numerous aspects.

An aspect is that the present invention provides a recess in the encapsulant. The encapsulant is formed such that a region over the base integrated circuit is exposed. The encapsulant recess provides a region within the extents of the encapsulant that is significantly lower than the surrounding extents of the encapsulant.

Another aspect is that the present invention provides a mounting surface over the base integrated circuit. The encapsulant recess provides an exposed region of the core substrate for the mounting surface. The core substrate provides electrical pads and connections in the encapsulant recess for mounting and connecting other devices.

It has been discovered that the disclosed structure provides stacking of packages. Multiple packages may be stacked one over the other rather than the attachment on the same planar or largely the same planar surface. The stacking increases the typically smaller height dimension rather than increasing the typically larger planar dimension resulting in size and performance improvements.

It has also been discovered that the disclosed structure provides stacking of integrated circuit die. The integrated circuit die can be stacked within a package that in turn can be stacked. Stacking the integrated circuit die within the package provides additional improvements in size and performance. The integrated circuit die can be stacked in the typically smaller dimension rather than mounted adjacent to one another across the typically larger planar dimension.

Yet another discovery is that the disclosed structure provides a smaller footprint or planar dimension of the stacked integrated circuit package system. The stacking of packages and integrated circuits allows multiple functions to fit into a smaller footprint than even some of the discrete devices placed individually on a substrate or other connection surface. The footprint area of the base substrate provides a significantly smaller area requirement.

Yet another discovery is that the disclosed structure allows the top package to be of a smaller size. The core substrate provides interconnection of a top package without the need for larger dimensions overlapping the bottom integrated circuit. Enabling a smaller top package provides significantly improved signal integrity, component choices, number of components, package area, and system space.

Yet another discovery of the disclosed structure is that top known good die can to be attached in many forms, such as direct chip attach, chip on board, flip chip, area array packages, leaded packages, or leadless packages. The interposer provides a flexible interface for compatibility to several different or multiple package connections. Integrated circuit die can be pre-tested to predetermine the known good die to attach.

Yet another discovery of the disclosed structure is that many types of integrated circuits, such as passive devices, integrated circuits, integrated circuits with integrated passives, or optical sensors, can be integrated. The encapsulant recess and the core substrate provide a packaging system compatible with many and varied components including varied functions, dimensions, and connection configurations.

Yet another discovery of the disclosed structure is that a package on package (PoP) configuration can be integrated with stacking of other components. The encapsulant cavity and interposer are compatible with any components including passives, integrated circuit die, and other packages. Other packages may be mounted on the first integrated circuit package with the encapsulant cavity and the interposer.

These and other valuable aspects of the present invention consequently further the state of the technology to at least the next level.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing a base substrate;
   attaching a base integrated circuit over the base substrate;
   attaching a core substrate over the base integrated circuit, the core substrate and a core substrate connection having sides facing the base substrate partially exposed from an attachment layer on the core substrate and the base integrated circuit;
   attaching a substrate electrical connector between the core substrate and the base substrate; and applying an encapsulant directly on a perimeter portion of a side of the core substrate opposite the base substrate and having a center portion of the side of the core substrate substantially exposed over the base integrated circuit.

2. The method as claimed in claim 1 further comprising attaching a top integrated circuit on a mounting surface of the core substrate.

3. The method as claimed in claim 1 wherein attaching the base integrated circuit comprises attaching a solder ball or a bond wire between the base integrated circuit and the base substrate.

4. The method as claimed in claim 1 wherein attaching the base integrated circuit comprises attaching another integrated circuit adjacent the base integrated circuit.

5. The method as claimed in claim 1 wherein attaching the base integrated circuit comprises attaching a base electrical connector over the base integrated circuit and part of the base substrate.

6. A method of manufacture of an integrated circuit package system comprising:
- forming a base substrate having a base connection pad;
- connecting a base integrated circuit with a base electrical connector over the base substrate;
- attaching a core substrate on an attachment layer on the base integrated circuit, the core substrate and a core substrate connection having sides facing the base substrate partially exposed from the attachment layer;
- connecting a substrate electrical connector between the core substrate and the base substrate;
- forming an encapsulant over a perimeter portion at an edge of the mounting surface of the core substrate having a core connection pad exposed in a center portion of the mounting surface over the base integrated circuit; and
- connecting a top electrical connector between a top integrated circuit and the core connection pad.

7. The method as claimed in claim 6 wherein connecting the base integrated circuit comprises attaching a bond wire between another integrated circuit on the base integrated circuit and the base substrate.

8. The method as claimed in claim 6 wherein connecting the base integrated circuit comprises attaching a flipchip on the base integrated circuit.

9. The method as claimed in claim 6 wherein forming the encapsulant comprises forming a mounting surface on the core substrate for a top integrated circuit.

10. The method as claimed in claim 6 wherein attaching the core substrate comprises providing the core substrate with lower routing density than routing density of the base substrate.

11. An integrated circuit package system comprising:
a base substrate;
a base integrated circuit over the base substrate;
a core substrate having a core substrate connection over the base integrated circuit;
an attachment layer on the core substrate and the base integrated circuit, the core substrate and the core substrate connection having sides facing the base substrate partially exposed from the attachment layer;
a substrate electrical connector between the core substrate and the base substrate; and
an encapsulant directly on a perimeter portion of a side of the core substrate opposite the base substrate and having a portion of the side of the core substrate substantially exposed over the base integrated circuit.

12. The system as claimed in claim 11 further comprising a top integrated circuit on a mounting surface of the core substrate.

13. The system as claimed in claim 11 further comprising a solder ball or a bond wire between the base integrated circuit and the base substrate.

14. The system as claimed in claim 11 further comprising another integrated circuit adjacent the base integrated circuit.

15. The system as claimed in claim 11 further comprising a base electrical connector over the base integrated circuit and part of the base substrate.

16. The system as claimed in claim 11 wherein:
the base substrate having a base connection pad;
the base integrated circuit with a base electrical connector over the base substrate;
the core substrate on an attachment layer over the base integrated circuit;
the substrate electrical connector between the core substrate and the base substrate;
the encapsulant over the core substrate having a core connection pad exposed over the base integrated circuit; and
further comprising:
a top electrical connector between a top integrated circuit and the core connection pad.

17. The system as claimed in claim 16 further comprising a bond wire between another integrated circuit on the base integrated circuit and the base substrate.

18. The system as claimed in claim 16 further comprising a flipchip on the base integrated circuit.

19. The system as claimed in claim 16 wherein the encapsulant comprises a mounting surface on the core substrate for a top integrated circuit.

20. The system as claimed in claim 16 wherein the core substrate comprises lower routing density than routing density of the base substrate.

* * * * *